(12) United States Patent
Guo et al.

(10) Patent No.: US 8,013,672 B2
(45) Date of Patent: Sep. 6, 2011

(54) PROGRAMMABLE GAIN AMPLIFIER AND EMBEDDED FILTER

(75) Inventors: Huimin Guo, Hong Kong (HK); Shuzuo Lou, Hong Kong (HK); Gang Qian, Hong Kong (HK); Wai Po Wong, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 22 days.

(21) Appl. No.: 12/652,934

(22) Filed: Jan. 6, 2010

(65) Prior Publication Data

US 2011/0163803 A1 Jul. 7, 2011

(51) Int. Cl.
*H03F 1/36* (2006.01)
(52) U.S. Cl. .......................... 330/86; 330/109
(58) Field of Classification Search .................. 330/86, 330/109, 282, 294

See application file for complete search history.

(56) References Cited

U.S. PATENT DOCUMENTS

| | | | |
|---|---|---|---|
| 5,233,309 A | 8/1993 | Spitalny et al. | |
| 5,412,346 A * | 5/1995 | Burger et al. | 330/282 |
| 7,193,455 B2 | 3/2007 | Lou et al. | |
| 7,368,987 B2 * | 5/2008 | Blon | 330/86 |
| 2004/0121735 A1 | 6/2004 | Tseng et al. | |
| 2005/0116767 A1 | 6/2005 | Cavazzoni | |

* cited by examiner

*Primary Examiner* — Steven J Mottola
(74) *Attorney, Agent, or Firm* — Ella Cheong; Margaret A. Burke; Sam T. Yip

(57) ABSTRACT

There is provided an integrated circuit having a programmable gain amplifier and an embedded filter. The programmable gain amplifier and the filter comprise a gain element having an inverting input for receiving an input and a feedback signal, a non-inverting input coupled to ground, and an output. The gain element also has one or more feedback loops coupling the output of the gain element to the inverting input of the gain element. Each feedback loop has a switch coupled in series with at least one passive component. Each switch has a first state to connect the corresponding feedback loop and a second state to disconnect the corresponding feedback loop. Each switch is programmatically configurable to provide a first gain and a first bandwidth and a second gain and a second bandwidth such that the first bandwidth is substantially equal to the second bandwidth.

14 Claims, 5 Drawing Sheets

PROGRAMMABLE GAIN AMPLIFIER AND EMBEDDED FILTER

TECHNICAL FIELD

The present invention relates generally to electronic circuits and, in particular, to a programmable gain amplifier and embedded filter.

BACKGROUND

In modern electronics, low power consumption and small size are a design priority.

One of the ways that power consumption and volume may be reduced is to minimize the number of components used. However, existing circuit arrangements typically require separate components for separate functions. For example, wireless transceivers may require an active amplifier for amplification and a separate active filter for filtering.

One of the ways to reduce the number of components is to use the same components for different functions. For example, a wireless transceiver may use a single active amplifier for both amplification and filtering, thereby reducing the number of components required.

Using a single active amplifier for both amplification and filtering is suitable for circuit arrangements in which the gain and cutoff frequency characteristics are static. However, this arrangement suffers from the disadvantage of being unsuitable for circuit arrangements where the gain or the cutoff frequency characteristics are required to be configurable. For example, by using a single active amplifier for both amplification and filtering, changing the gain of the amplifier will necessarily affect the cutoff frequency and visa versa.

To overcome this problem, existing circuit arrangements resort to using separate active amplifiers such that the configuration of the gain of the first amplifier does not affect the cutoff frequency of the second amplifier. However, this arrangement suffers from the disadvantage of consuming more power and having a larger size.

A need therefore exists to overcome, or at least ameliorate, the disadvantages of existing arrangements.

SUMMARY

According to one aspect, there is provided an integrated circuit having a programmable gain amplifier and an embedded filter. The programmable gain amplifier and the filter comprise a gain element having an inverting input for receiving an input and a feedback signal, a non-inverting input coupled to ground, and an output. The gain element also has one or more feedback loops coupling the output of the gain element to the inverting input of the gain element. Each feedback loop has a switch coupled in series with at least one passive component. Each switch has a first state to connect the corresponding feedback loop and a second state to disconnect the corresponding feedback loop. Each switch is programmatically configurable to provide a first gain and a first bandwidth and a second gain and a second bandwidth such that the first bandwidth is substantially equal to the second bandwidth.

According to another aspect, there is provided an integrated circuit having a programmable gain amplifier and an embedded filter. The programmable gain amplifier and the filter comprise a gain element having an inverting input for receiving an input and a feedback signal, a non-inverting input for receiving an input and a feedback signal, an inverting output and a non-inverting output. The gain element also has one or more feedback loops coupling the non-inverting output of the gain element to the inverting input of the gain element and one or more feedback loops coupling the inverting output of the gain element to the non-inverting input of the gain element. Each feedback loop has a switch coupled in series with at least one passive component. Each switch has a first state to connect the corresponding feedback loop and a second state to disconnect the corresponding feedback loop. Each switch is programmatically configurable to provide a first gain and a first bandwidth and a second gain and a second bandwidth such that the first bandwidth is substantially equal to the second bandwidth.

BRIEF DESCRIPTION OF THE DRAWINGS

At least one embodiment of the present invention is described hereafter with reference to the drawings and appendices, in which.

DETAILED DESCRIPTION

Figure 1:
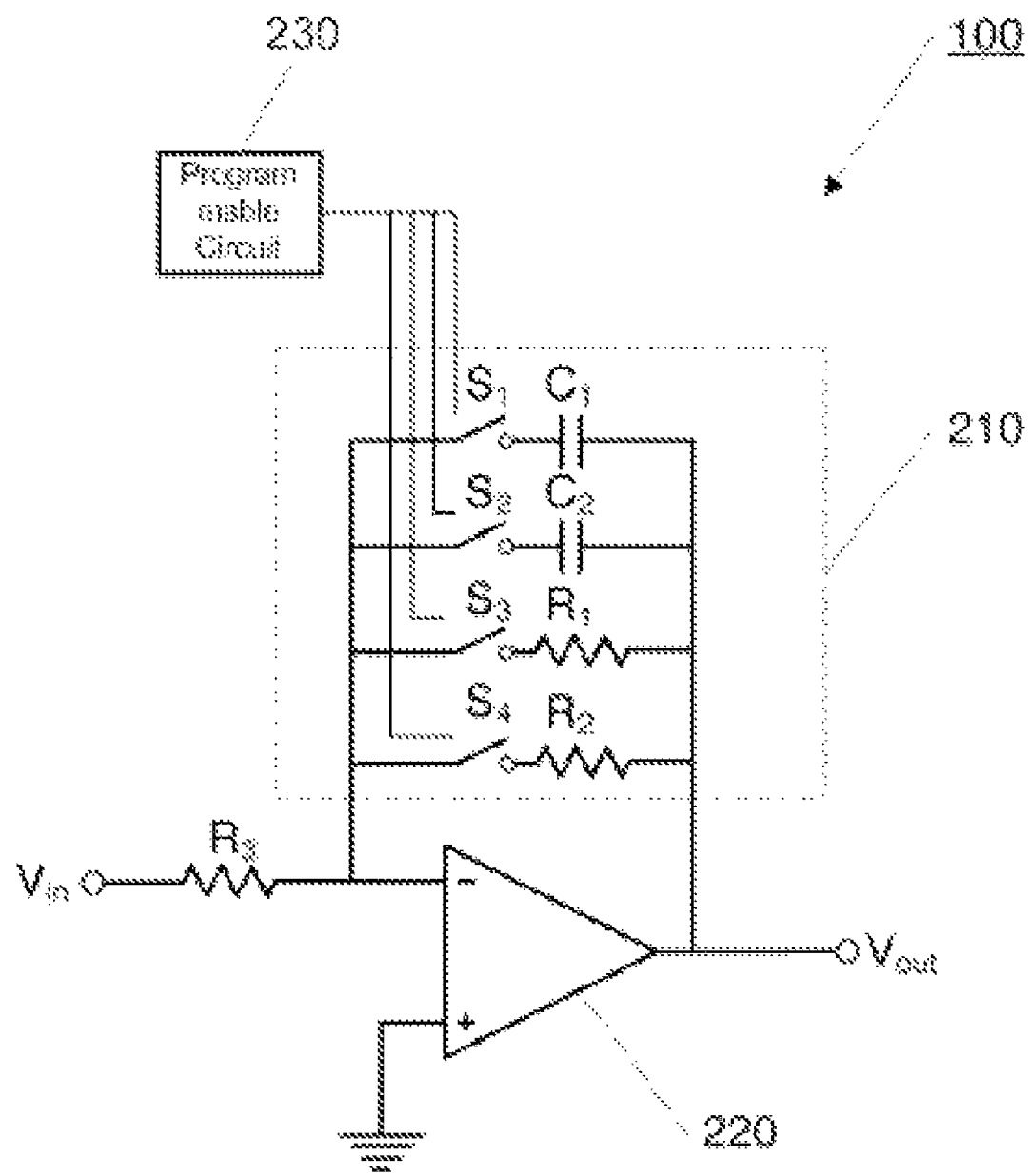
FIG. 1 shows a programmable gain amplifier having an embedded filter according to an embodiment of the present invention.

FIG. 1 shows a programmable gain amplifier 100 having an embedded filter. Amplifier 100 may be used in wireless transceiver applications. Preferably, the programmable gain amplifier 100 and the filter are embedded on a single integrated circuit.

The amplifier 100 comprises a gain element 220 having an inverting input for receiving an input and a feedback signal, a non-inverting input coupled to ground, and an output.

The amplifier 100 comprises one or more feedback loops 210 coupling the output of the gain element 220 to the inverting input of the gain element 220. Four parallel feedback loops are depicted in FIG. 1. Each feedback loop comprises a switch ($S_1$-$S_4$) coupled in series with resistive passive components $R_1$ and $R_2$ and capacitive passive components $C_1$ and $C_2$. The passive components $C_1$ and $C_2$ determine the bandwidth of the amplifier 100 and the passive components $R_1$ and $R_2$ define both the gain and the bandwidth of the amplifier 100.

Each switch (S1-S4) may either be configured manually or automatically. For example, switches (S1-S4) may be configured by a programmable circuit 230 executing program code or by an auto calibration circuit. Each switch (S1-S4) may be an NMOS, PMOS or CMOS switch. Each switch (S1-S4) has a first state that connects the respective feedback loop and a second state that disconnects the corresponding feedback loop. In alternative embodiments, each switch is a multi-select switch, being configurable to connect or disconnect more than one feedback loop.

The configuration of each switch ($S_1$-$S_4$) affects the gain and bandwidth characteristics of the amplifier 100. For example, the gain and bandwidth of the amplifier 100 are shown in Appendix 1 according to the configuration of each switch ($S_1$-$S_4$).

Each switch ($S_1$-$S_4$) is configurable to adjust the gain of the amplifier 100 without substantially affecting the bandwidth of the amplifier. For example, each switch ($S_1$-$S_4$) is programmatically configurable to provide the amplifier 100 with a first gain and a first bandwidth, and a second gain and a second bandwidth where the second bandwidth is substantially equal to the first bandwidth.

In a specific example, in order to double the gain of the amplifier 100 while maintaining the bandwidth of the amplifier 100, the following component values could be chosen:

$$R_1 = 2R_2$$
$$C_1 = \frac{1}{2}C_2$$

As such, switching from position 1 to position 2 as shown in Table 1 would double the gain of circuit 200 while substantially maintaining the bandwidth (i.e. maintain the cutoff frequency).

TABLE 1

| Position | S1(C1) | S2(C2) | S3(R1) | S4(R2) | Bandwidth | Gain |
|---|---|---|---|---|---|---|
| 1 | open | closed | open | closed | $f = \frac{1}{2\pi R_2 C_2}$ | $\frac{-R_2}{R_3}$ |
| 2 | closed | open | closed | open | $f = \frac{1}{2\pi R_1 C_1}$ | $\frac{-R_1}{R_3}$ |

In other embodiments, the number of feedback loops 210 may be increased to increase the number of configurations having differing gains but the same bandwidth.

Figure 2:
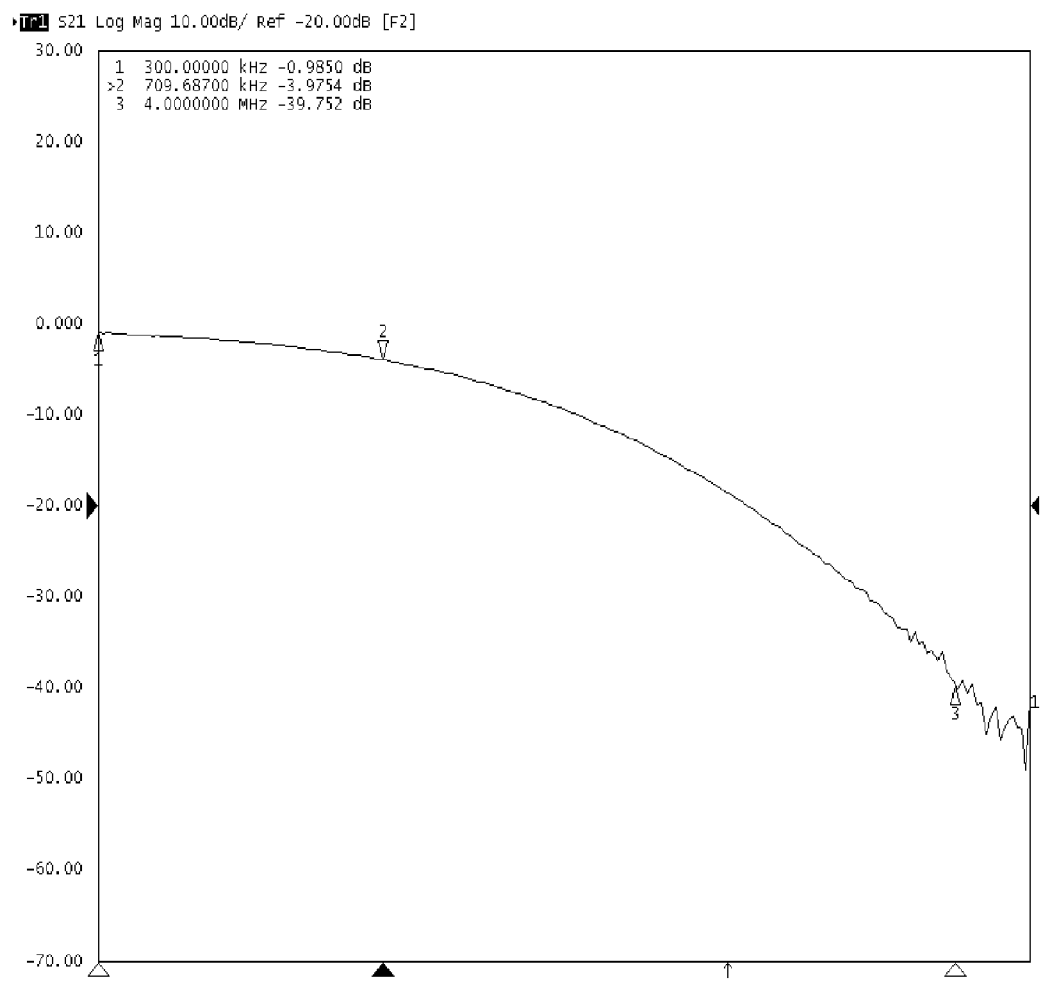
FIGS. 2, 3 and 4 show exemplary test results of an embodiment of the present invention.
Figure 3:
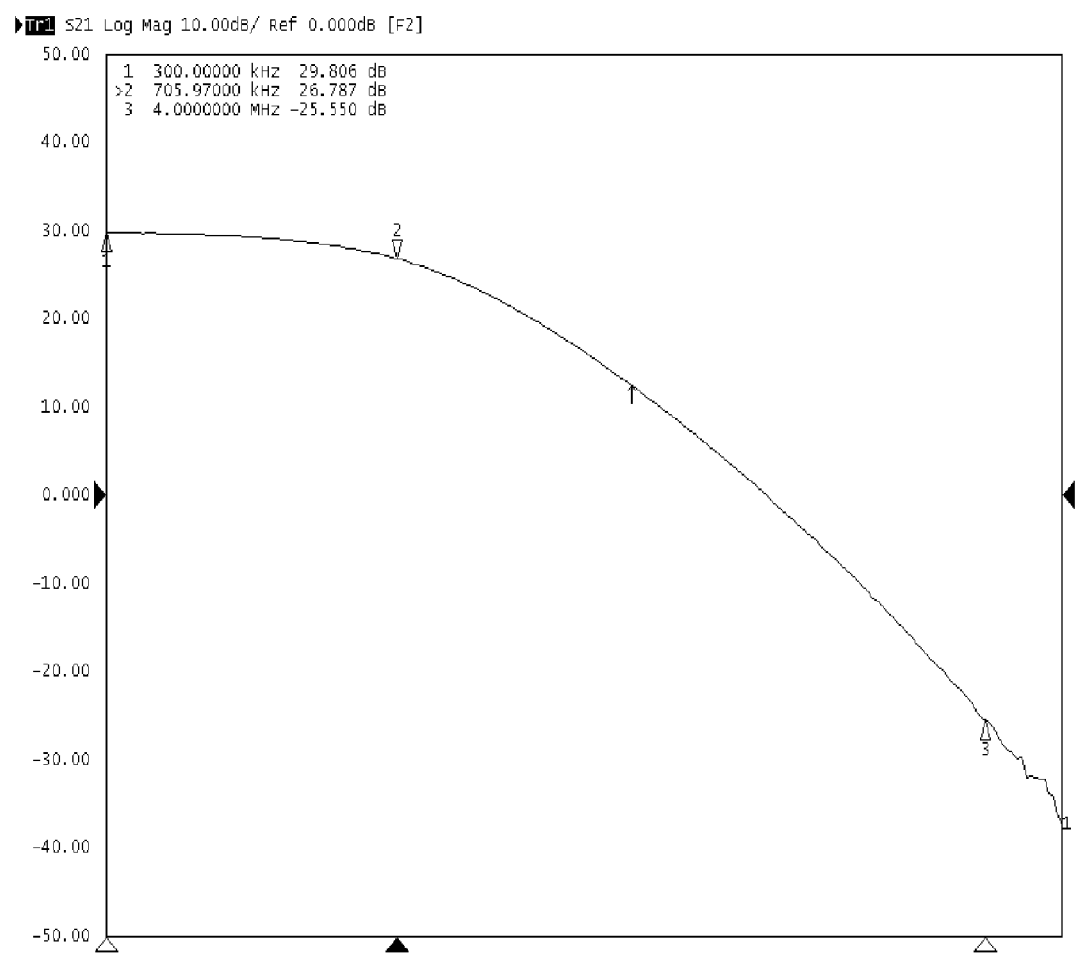
Figure 4:
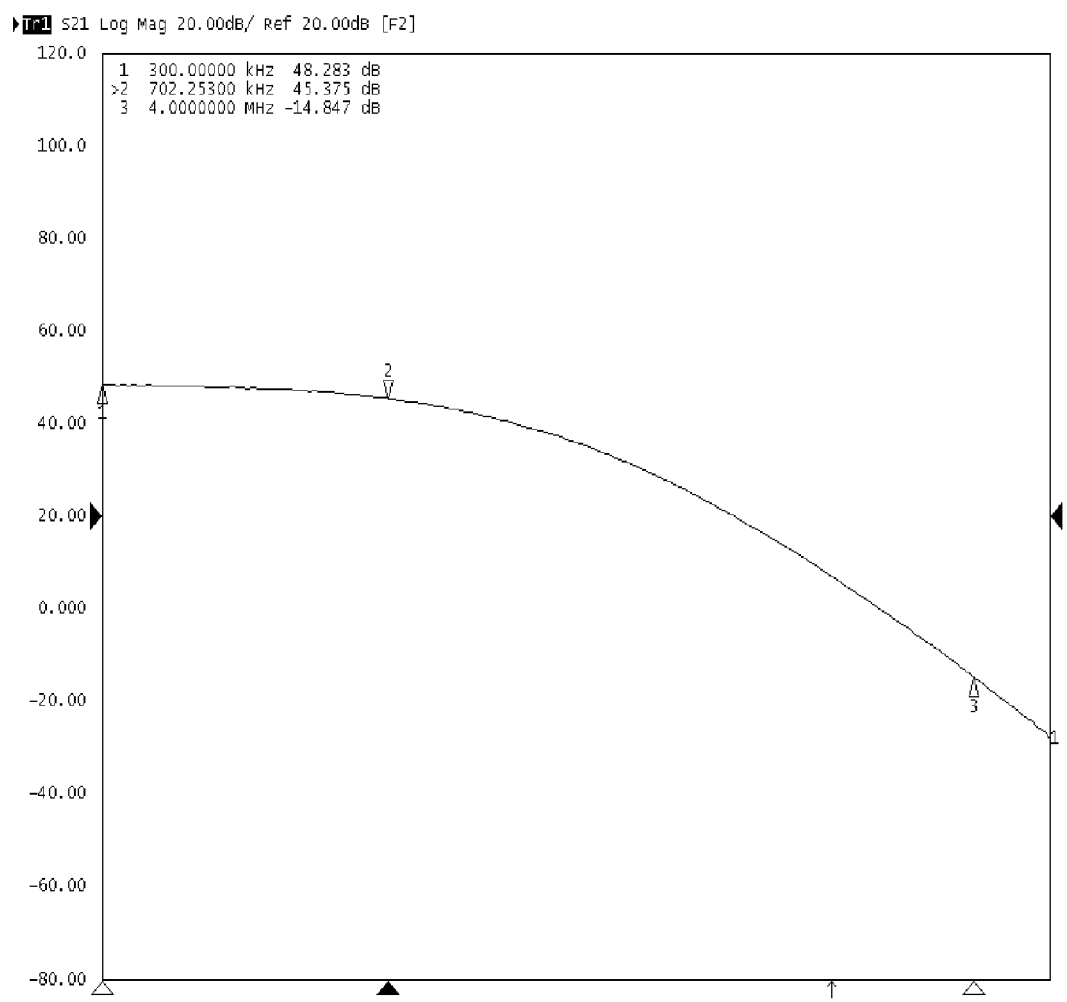

Exemplary (test) measurement results for an amplifier 100 are given in FIGS. 2, 3 and 4 in which the gain, cutoff frequency and 4 MHz rejection for three different switch configurations are summarized in Table 2:

TABLE 2

| | Gain | Bandwidth | Rejection @ 4 MHz |
|---|---|---|---|
| Switch configuration 1 | 0 dB | 709 kHz | −39 dB |
| Switch configuration 2 | 30 dB | 706 kHz | −55 dB |
| Switch configuration 3 | 50 dB | 702 kHz | −62 dB |

As can be seen from the results of Table 2, the gain of the amplifier may be adjusted while substantially maintaining the bandwidth.

Figure 5:
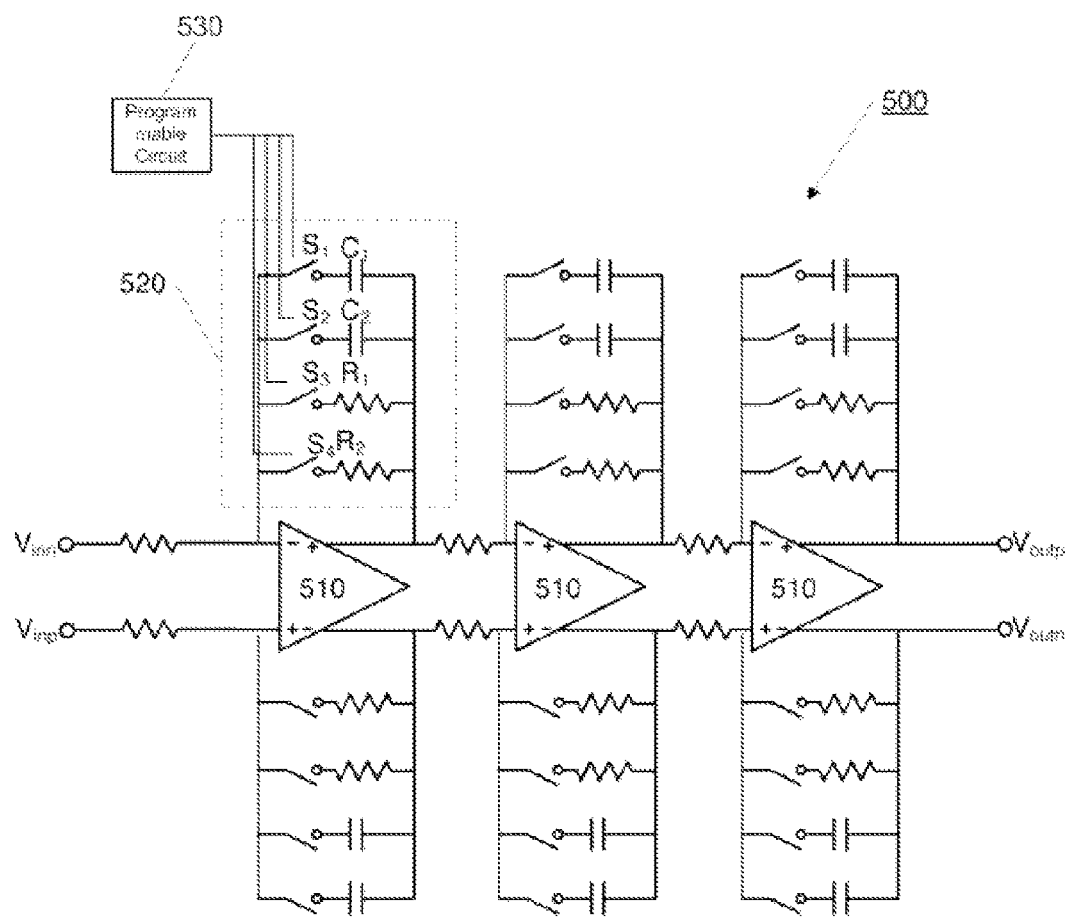
FIG. 5 shows a fully differential amplifier according to an embodiment of the present invention.

FIG. 5 shows a fully differential amplifier 500 having embedded filters for amplifying and filtering input signals $V_{inn}$ and $V_{inp}$ and producing output signals $V_{outp}$ and $V_{outn}$. Amplifier 500 comprises three fully differential amplifiers 510 connected in series. Each fully differential amplifier 510 has an inverting and a non-inverting output for receiving a signal and a feedback signal and a positive and a negative output. Each inverting and non-inverting inputs of each fully differential amplifier 510 is coupled to an input resistor.

Each differential amplifier 510 is provided with first feedback loops 520 coupling the positive output of the fully differential amplifier 510 to the inverting input of the fully differential amplifiers 510 and corresponding second feedback loops coupling the negative output of the fully differential amplifier 510 to the non-inverting input of the differential amplifier 510. Feedback loops 520 comprise resistive passive components R1 and R2 and capacitive passive components C1 and C2, each passive component being connected in series with a switch (S1-S4). Each switch (S1-S4) is configurable to connect or disconnect the resistive passive components R1 and R2 in order adjust the gain of the amplifier 500 and connect or disconnect the capacitive passive components C1 and C2 in order to substantially maintain the bandwidth of the amplifier. Each switch (S1-S4) may either be configured manually or automatically. For example, switches (S1-S4) may be configured by a programmable circuit 530 executing program code or by an auto calibration circuit.

The foregoing describes only some embodiments of the present invention, and modifications and/or changes can be made thereto without departing from the scope and spirit of the invention, the embodiments being illustrative and not restrictive.

APPENDIX 1

| | | | | Gain and cutoff frequency by switch position | |
|---|---|---|---|---|---|
| S1(C1) | S2(C2) | S3(R1) | S4(R2) | Bandwidth | Gain |
| open | open | open | open | — | — |
| open | open | open | closed | — | $\frac{-R_2}{R_3}$ |
| open | open | closed | open | — | $\frac{-R_1}{R_3}$ |
| open | open | closed | closed | — | $\frac{-\left(\frac{1}{R_1}+\frac{1}{R_2}\right)^{-1}}{R_3}$ |
| open | closed | open | open | — | — |
| open | closed | open | closed | $f = \frac{1}{2\pi R_2 C_2}$ | $\frac{-R_2}{R_3}$ |
| open | closed | closed | open | $f = \frac{1}{2\pi R_1 C_2}$ | $\frac{-R_1}{R_3}$ |

APPENDIX 1-continued

Gain and cutoff frequency by switch position

| S1(C1) | S2(C2) | S3(R1) | S4(R2) | Bandwidth | Gain |
|---|---|---|---|---|---|
| open | closed | closed | closed | $f = \dfrac{1}{2\pi\left(\dfrac{1}{R_1}+\dfrac{1}{R_2}\right)^{-1} C_2}$ | $\dfrac{-\left(\dfrac{1}{R_1}+\dfrac{1}{R_2}\right)^{-1}}{R_3}$ |
| closed | open | open | open | — | — |
| closed | open | open | closed | $f = \dfrac{1}{2\pi R_2 C_1}$ | $\dfrac{-R_2}{R_3}$ |
| closed | open | closed | open | $f = \dfrac{1}{2\pi R_1 C_1}$ | $\dfrac{-R_1}{R_3}$ |
| closed | open | closed | closed | $f = \dfrac{1}{2\pi\left(\dfrac{1}{R_1}+\dfrac{1}{R_2}\right)^{-1} C_1}$ | $\dfrac{-\left(\dfrac{1}{R_1}+\dfrac{1}{R_2}\right)^{-1}}{R_3}$ |
| closed | closed | open | open | — | — |
| closed | closed | open | closed | $f = \dfrac{1}{2\pi R_2 (C_1 + C_2)}$ | $\dfrac{-R_2}{R_3}$ |
| closed | closed | closed | open | $f = \dfrac{1}{2\pi R_1 (C_1 + C_2)}$ | $\dfrac{-R_1}{R_3}$ |
| closed | closed | closed | closed | $f = \dfrac{1}{2\pi\left(\dfrac{1}{R_1}+\dfrac{1}{R_2}\right)^{-1}(C_1 + C_2)}$ | $\dfrac{-\left(\dfrac{1}{R_1}+\dfrac{1}{R_2}\right)^{-1}}{R_3}$ |

The invention claimed is:

1. An apparatus for providing programmable gain amplification and low-pass filtering with a static cutoff frequency, comprising:
    a programmable gain amplifier having an embedded filter in said programmable gain amplifier, comprising:
        a gain element having an inverting input for receiving an input and a feedback signal, a non-inverting input coupled to ground, and an output;
        a first resistor coupled to the inverting input of the gain element, the input signal being directed through the first resistor then to the inverting input of the gain element; and
        one or more feedback loops coupling said output of said gain element to said inverting input of said gain element, each said feedback loop comprising a switch coupled in series with at least one passive component, each said switch having a first state to connect the corresponding feedback loop and a second state to disconnect the corresponding feedback loop;
    wherein each said switch being programmatically configurable to provide said apparatus with a first gain and a first bandwidth, and each said switch being programmatically configurable to provide said apparatus with a second gain and a second bandwidth, said first bandwidth being substantially equal to said second bandwidth; and
    wherein the switches being programmatically configurable to adjust gain of said apparatus without substantially affecting the bandwidth of said apparatus.

2. The apparatus as claimed in claim 1, wherein said apparatus is used in a wireless transceiver.

3. The apparatus as claimed in claim 1, being implemented on a single integrated circuit.

4. The apparatus as claimed in claim 1, wherein each said switch is selected from the set of switches comprising CMOS, PMOS and NMOS switches.

5. The apparatus as claimed in claim 1, wherein said at least one passive component is selected from passive components comprising resistors and capacitors.

6. The apparatus as claimed in claim 1, wherein said filter is a low pass filter.

7. The apparatus as claimed in claim 1, wherein each said switch is programmatically configured by a programmable circuit executing program code.

8. An apparatus for providing programmable differential gain amplification and low-pass filtering with a static cutoff frequency, comprising:
    a programmable gain amplifier having an embedded filter in said programmable gain amplifier, comprising:
        a gain element having an inverting input for receiving an input and a feedback signal, a non-inverting input for receiving an input and a feedback signal, an inverting output and a non-inverting output;
        a first resistor coupled to the inverting input of the gain element, the input signal being directed through the first resistor then to the inverting input of the gain element;
        a second resistor coupled to the non-inverting input of the gain element, the input signal being directed through the second resistor then to the non-inverting input of the gain element; and
        one or more feedback loops coupling said non-inverting output of said gain element to said inverting input of said gain element and one or more feedback loops coupling said inverting output of said gain element to said non-inverting input of said gain element, each said feedback loop comprising a switch coupled in series with at least one passive component, each said switch having a first state to connect the corresponding feedback loop and a second state to disconnect the corresponding feedback loop;

wherein each said switch being programmatically configurable to provide said apparatus with a first gain and a first bandwidth, and each said switch being programmatically configurable to provide said apparatus with a second gain and a second bandwidth, said first bandwidth being substantially equal to said second bandwidth; and wherein the switches being programmatically configurable to adjust gain of said apparatus without substantially affecting the bandwidth of said apparatus.

9. The apparatus as claimed in claim 8, wherein said apparatus is used in a wireless transceiver.

10. The apparatus as claimed in claim 8, being implemented on a single integrated circuit.

11. The apparatus as claimed in claim 8, wherein each said switch is selected from the set of switches comprising CMOS, PMOS and NMOS switches.

12. The apparatus as claimed in claim 8, wherein said at least one passive component is selected from passive components comprising resistors and capacitors.

13. The apparatus as claimed in claim 8, wherein said filter is a low pass filter.

14. The apparatus as claimed in claim 8, wherein each said switch is programmatically configured by a programmable circuit executing program code.

\* \* \* \* \*